(12) United States Patent
Tsai et al.

(10) Patent No.: US 9,595,671 B1
(45) Date of Patent: Mar. 14, 2017

(54) METHODS OF FABRICATING STORAGE ELEMENTS AND STRUCTURES HAVING EDGELESS FEATURES FOR PROGRAMMABLE LAYER(S)

(71) Applicant: Adesto Technologies Corporation, Sunnyvale, CA (US)

(72) Inventors: Kuei Chang Tsai, Cupertino, CA (US); Jeffrey Allan Shields, Sunnyvale, CA (US); Pascal Verrier, Saint Maur des Fosses (FR)

(73) Assignee: Adesto Technologies Corporation, Santa Clara, CA (US)

( * ) Notice: Subject to any disclaimer, the term of this patent is extended or adjusted under 35 U.S.C. 154(b) by 0 days.

(21) Appl. No.: 15/214,224

(22) Filed: Jul. 19, 2016

Related U.S. Application Data

(62) Division of application No. 13/830,315, filed on Mar. 14, 2013, now Pat. No. 9,412,945.

(51) Int. Cl.
*H01L 21/20* (2006.01)
*H01L 45/00* (2006.01)

(52) U.S. Cl.
CPC ........ *H01L 45/1683* (2013.01); *H01L 45/085* (2013.01); *H01L 45/124* (2013.01); *H01L 45/1266* (2013.01); *H01L 45/141* (2013.01); *H01L 45/146* (2013.01)

(58) Field of Classification Search
CPC ....................................................... H01L 21/20
See application file for complete search history.

(56) References Cited

PUBLICATIONS

U.S. Appl. No. 13/830,315, filed Mar. 14, 2013, by Kuei Chang Tsai et al., parent of the present application.

*Primary Examiner* — Marvin Payen

(57) ABSTRACT

A method can include forming a bottom structure with a top surface and a side surface that form at least one edge; forming an opening with sloped sides through at least one insulating layer to expose at least a portion of the top surface of the bottom structure; forming a programmable layer over the at least one edge, in contact with the sloped sides of the opening and the top surface of the bottom structure; and forming a top layer over the programmable layer and opening; wherein the programmable layer is programmable between at least two different impedance states.

17 Claims, 21 Drawing Sheets

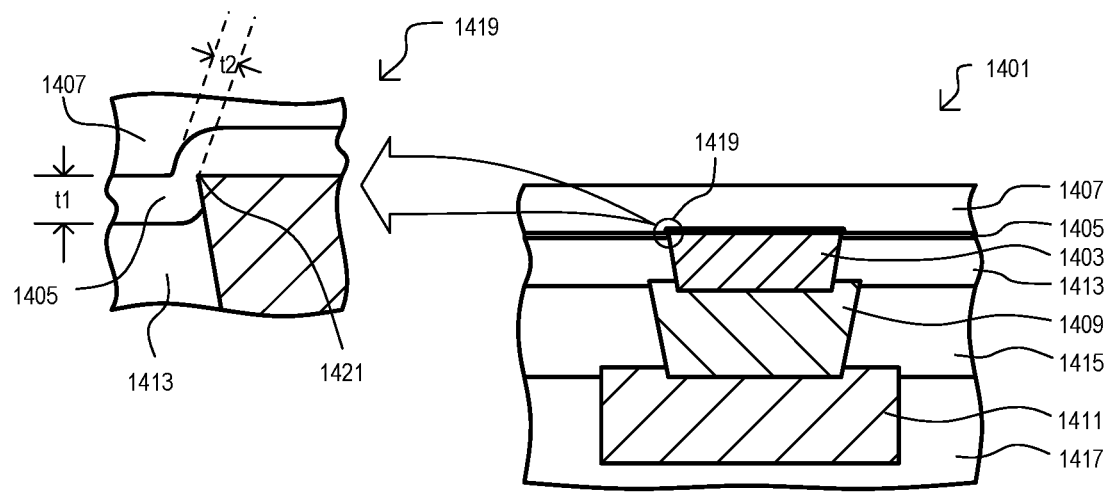
FIG. 14
(CONVENTIONAL)

METHODS OF FABRICATING STORAGE ELEMENTS AND STRUCTURES HAVING EDGELESS FEATURES FOR PROGRAMMABLE LAYER(S)

RELATED APPLICATIONS

This application is a divisional of U.S. patent application Ser. No. 13/830,315 filed Mar. 14, 2013, the contents of which are incorporated by reference herein.

TECHNICAL FIELD

The present disclosure relates generally to storage elements for storing data in integrated circuits, and more particularly to storage elements that store data by changing an impedance of one or more programmable layers.

BACKGROUND

FIG. 14 shows a conventional storage element 1401 that includes a bottom electrode 1403, a metal oxide layer (or chalcogenide layer) 1405, and an active layer 1407. A layer 1405 can be a solid electrolyte layer. In response to electric fields, conductive regions can be created and dissolved within the layer 1405 with metal ions provided from active layer 1407 (or an ion buffer layer). A layer 1405 can be a very thin layer, as compared to a thickness of a bottom electrode 1403.

Bottom electrode 1403 is formed in a first insulating layer 1413, and is in contact with a first interconnect (I/C) pattern 1409 formed in a second insulating layer 1415. First I/C pattern 1409 is in contact with a second I/C pattern 1411 formed in a third insulating layer 1417.

Referring still to FIG. 14, a conventional storage element 1401 can have a corner structure 1419. As shown, a bottom electrode 1403 can have an edge 1421 even after planarization steps have been performed. While such an edge 1421 is relatively small as compared to a thickness of the first electrode and interconnect layers, the edge 1421 can result in a thinning of the layer 1405. This shown by a thickness t2 being smaller than thickness t1.

A thinning of layer 1405 at edge 1421 can introduce undesirable variations in the performance of the conventional storage element 1401.

BRIEF DESCRIPTION OF THE DRAWINGS

FIG. 14 is a side cross sectional view of a conventional conductive bridging random access memory (CBRAM) element.

DETAILED DESCRIPTION

Figure 1:
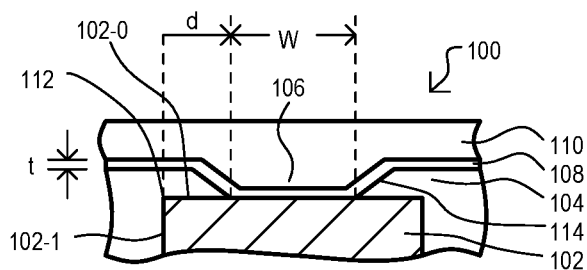
FIG. 1 is a side cross sectional view of a storage element according to one embodiment.

Embodiments described herein show structures and methods for storage elements having an "edgeless" structure with respect to a programmable layer. Embodiments can include storage elements with a programmable layer that can be formed on an edgeless topography, avoiding irregular thickness that can result from a topography with edges.

In embodiments below, like items are referred to by the same reference character, but with the leading digit(s) corresponding to the figure number.

FIG. 1 is a side cross sectional view of a storage element 100 according to a first embodiment. A storage element 100 can include a bottom structure 102, an insulating layer 104, a programmable layer 108, and a top layer 110.

A bottom structure 102 can include an edge 112 formed at the intersection of a top surface 102-0 and a side surface 102-1. An edge 112 can have, or present the possibility of, topography that can be adverse to very thin layers, like that described in FIG. 14. While FIG. 1 shows a bottom structure 102 having a side surface 102-1 that is perpendicular to a top surface 102-0, other embodiments can have side surfaces that are sloped away from or toward a top surface (i.e., negative or positive slopes). A side surface 102-1 can also have a non-linear shape.

In some embodiments a bottom structure 102 can be a bottom electrode, being formed of one or more conductive materials. By application of voltages between such a bottom electrode and a top electrode (which may or may not include top layer 110), a programmable layer 108 can be programmed between different impedance states.

In some embodiments, a programmable layer 108 can include a solid electrolyte, and a bottom structure 102 can be an "inert" electrode, that does not include elements that ion conduct within programmable layer 108. When a bottom structure 102 serves as an inert electrode, it can be formed from any suitable conductive material or combination of conductive materials. In very particular embodiments, a bottom electrode can include tantalum (Ta) and/or tungsten (W).

In alternate embodiments, a bottom structure 102 can include an active layer that is a source of one or more elements that can ion conduct within a programmable layer 108. Such an active layer can include any of: a layer of one or more metals that ion conduct in programmable layer 108;

an alloy of a metal that ion conducts in programmable layer 108; or a chalcogenide in combination with a metal that can ion conduct in programmable layer 108.

An insulating layer 104 can extend above a top surface 102-0 of bottom structure and can separate an edge 112 from programmable layer 108 to remove any adverse effects an edge 112 can present on overlying layers. An insulating layer 104 can be formed from any suitable insulating material or combination of insulating materials. In particular embodiments, an insulating layer 104 can be formed from silicon nitride.

An opening 106 can be formed through insulating layer 104 to expose a top surface 102-0 of bottom structure 102. An opening 106 can have a width (W) where it exposes the bottom structure 102, and can be offset from edge 112 in a lateral direction. The offset amount is shown as "d" in FIG. 1. An opening 106 can have sloped sides 114 to present a favorable topography for a subsequently deposited thin overlayer (e.g., programmable layer). While FIG. 1 shows an opening with sides having an essentially linear slope, alternate embodiments can include other slope types, including non-linear shapes.

A programmable layer 108 can be formed within opening 106, including along sloped sides 114. A programmable layer 108 can be programmed between two or more impedance states in response to applied electric fields. An impedance state can be static or dynamic. That is, a programmable layer 108 can be programmed to an impedance state that remains substantially the same during a read (e.g., sense) operation. Alternatively, an impedance state can be dynamic, changing an impedance value during a read operation. In very particular embodiments, an impedance can be a resistance, with the programmable layer 108 being programmed between two or more resistance values.

As noted above, in some embodiments, a programmable layer 108 can be a solid electrolyte, and different impedance states can be established by an arrangement of one or more elements that ion conduct within the programmable layer 108.

In some embodiments, a programmable layer 108 can include a metal oxide. In particular embodiments, such a metal oxide can be a "high-K" dielectric material, having a dielectric constant greater than that of silicon dioxide. In some very particular embodiments, such a metal oxide can include any of: aluminum oxide, zirconium oxide, lanthanum oxide, hafnium oxide, or gadolinium oxide, including combinations of such layers. In addition or alternatively, a programmable layer 108 can include a chalcogenide.

A programmable layer 108 can be thin relative to other layers of a storage element 100. The sloped sides 114 of opening 106 can enable a programmable layer 108 to be formed with substantially uniform thickness, in contrast to a structure like that of FIG. 14, in which an edge can result in thinning. In some embodiments, a programmable layer 108 can have a thickness (t) that is no more than 20% of an opening width (W). In some embodiments, a programmable layer 108 can have a thickness of less than 50 nm, preferably less than 25 nm, even more preferably less than 10 nm.

A top layer 110 can be formed over, and in contact with, programmable layer 108. A top layer 110 can extend into opening 106. In some embodiments, a programmable layer 108 includes a solid electrolyte, and a top layer 110 can include an active layer that is in contact with programmable layer 108. Such an active layer can be a source of one or more elements that can ion conduct within the programmable layer 108. In some embodiments, an active layer can include any of: a layer of one or more metals that ion conduct in programmable layer 108; an alloy of a metal that ion conducts in programmable layer 108; or a chalcogenide in combination with a metal that can ion conduct in programmable layer 108.

In alternate embodiments, a top layer 110 can be an "inert" electrode that does not include elements that ion conduct within programmable layer 108. In such an arrangement, a top layer 110 can be formed from any suitable conductive material or combination of conductive materials.

Figure 2:
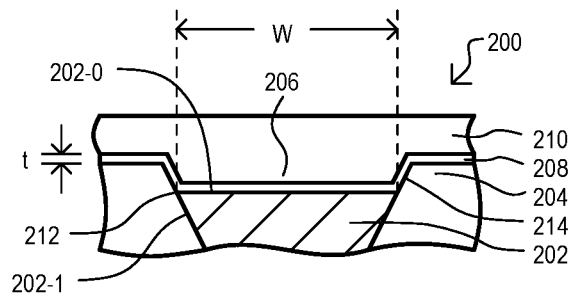
FIG. 2 is a side cross sectional view of a storage element according to another embodiment.

FIG. 2 is a side cross sectional view of a storage element 200 according to another embodiment. A storage element 200 can include a bottom structure 202, insulating layer 204, opening 206, and top layer 210. Such structures can be subject to the same variations as described for FIG. 1.

Memory element 200 can differ from that of FIG. 1 in that a side surface 102-1 of bottom structure 102 can slope inward. Further, sloped sides 214 of opening 206 can form part of a same profile as side surface 202-1. In particular embodiments, a storage element 200 can have a single side profile (e.g., linear as in FIG. 2, or non-linear), with one portion of the profile including a side surface of bottom structure (e.g., 202-1) and another portion forming a sloped side of an opening (e.g., 214). Accordingly, unlike the storage element 100 of FIG. 1, an opening 206 is not offset with respect to an edge 212.

Figure 3:
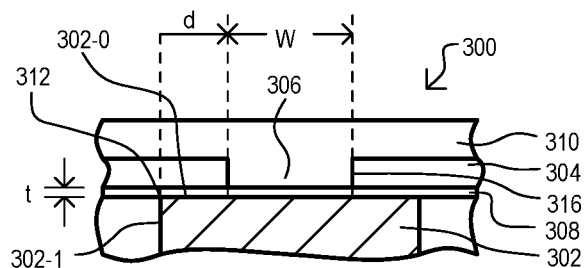
FIG. 3 is a side cross sectional view of a storage element according to a further embodiment.

FIG. 3 is a side cross sectional view of a storage element 300 according to a further embodiment. A storage element 300 can include a bottom structure 302, insulating layer 304, opening 306, and top layer 310. Such structures can be subject to the same variations as described for FIG. 1.

Storage element 300 can differ from that of FIG. 1 in that a programmable layer 308 can be formed below an insulating layer 304. An opening 306 can be offset from an edge 312 of bottom structure 302 by a distance (shown as "d"), thus a top layer 310 does not contact programmable layer 308 in the vicinity of edge 312. It is understood that in some embodiments an opening 306 can have sides 316 that are not sloped, but in other embodiments, sides 316 can be sloped.

Having described storage element structures according to various embodiments, methods of making storage elements will now be described in a series of side cross sectional views.

It is noted that an embodiment like that of FIG. 2 can form storage elements that can follow a minimum opening size or feature size (i.e., a width "W" can be the size of a minimum opening achievable at manufactured layer, or minimum feature size at such a layer). This is in contrast to embodiments like that of FIGS. 1 and 3 which include an offset ("d") between an edge of a bottom structure and the opening that exposes a bottom structure. That is, for an embodiment of FIG. 2, a bottom structure 202 can have a width W, while in FIGS. 1 and 3, a bottom structure 102/302 can have a width of W+2d (where W is the opening size).

FIGS. 4A to 4I show a method of making of storage element 400 according to one particular embodiment. A storage element 400 can be one implementation of that shown in FIG. 1.

Figure 4A:
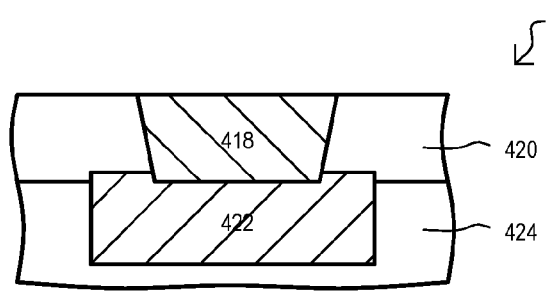
FIGS. 4A to 4I are a sequence of side cross sectional views showing methods of forming a storage element like that of FIG. 1, according to one particular embodiment.

FIG. 4A shows an initial structure 400' that includes a first lower interconnect (I/C) structure 418 formed in a first lower insulating layer 420. First I/C structure 418 can be in contact with a second I/C structure 422 formed in a second lower insulating layer 424. First and second I/C structure (418/422) can provide vertical interconnection to other conductive layers, a horizontal interconnection to other conductive layers, or combinations thereof. In some embodiments, first I/C structure 418 can be a via (i.e., vertical interconnect structure) and second I/C structure 422 can be an interconnect pattern. In some embodiments, a first I/C structure 418 can be a tungsten "plug". In addition, in some embodiments, a second I/C structure 422 can be a copper interconnect pattern.

Lower insulating layers 420/424 can be formed from any suitable insulating material, including but not limited to silicon oxide (including doped and undoped forms); silicon nitride; silicon oxynitride; and/or polyimide, to name but a few.

FIG. 4A shows a starting structure on which a storage element can be formed. That is, according to embodiments, a storage element can be formed on relatively higher layers of integrated circuit device (i.e., at the "backend" of a process). This is in sharp contrast to storage elements formed on a planar substrate.

Figure 4B:
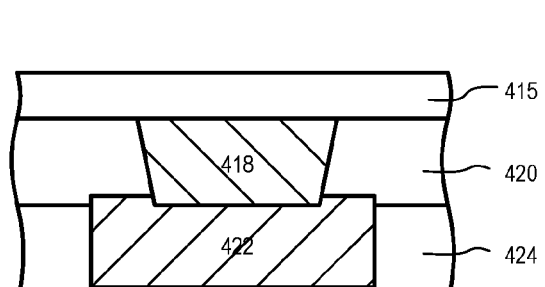

FIG. 4B shows the formation of a bottom structure insulating layer 415 over first I/C structure 418 and first lower insulating layer 420. Insulating layer 415 can be formed of any suitable insulating material, including but not limited to: silicon oxide (including doped and undoped forms); silicon nitride; silicon oxynitride; and/or polyimide, to name but a few.

Figure 4C:
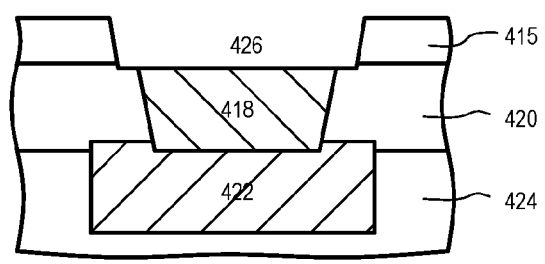

FIG. 4C shows the formation of a bottom structure opening 426 through bottom structure insulating layer 415 that exposes lower I/C structure 418.

Figure 4D:
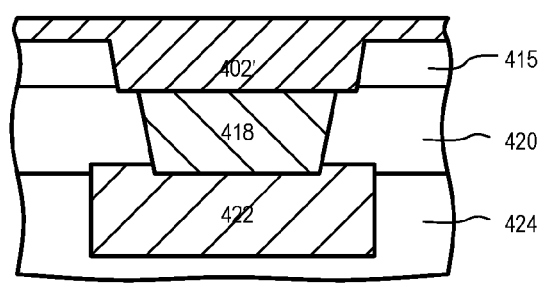

FIG. 4D shows the formation of bottom structure material(s) 402'. Such materials 402' can be any of those described in embodiments herein, or equivalents, including those for an inert electrode, or alternatively, an active layer. In one very particular embodiment, bottom structure material 402' can include tantalum.

Figure 4E:
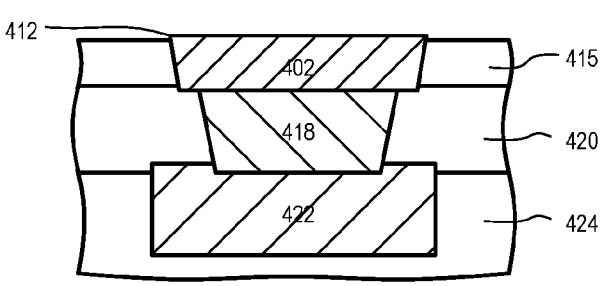

FIG. 4E shows an initial structure 400' following planarization of a top surface. Such a step can remove potions of a bottom structure material 402' to expose insulating layer 415, and form bottom structure 402. In this way, a bottom structure 402 can be formed with a "damascene" type process. Such a planarization can include cleaning steps.

As shown, the formation of bottom structure 402 can include an edge 412, which can present an adverse topography for subsequent thin layers, as noted in conjunction with FIG. 14.

Figure 4F:
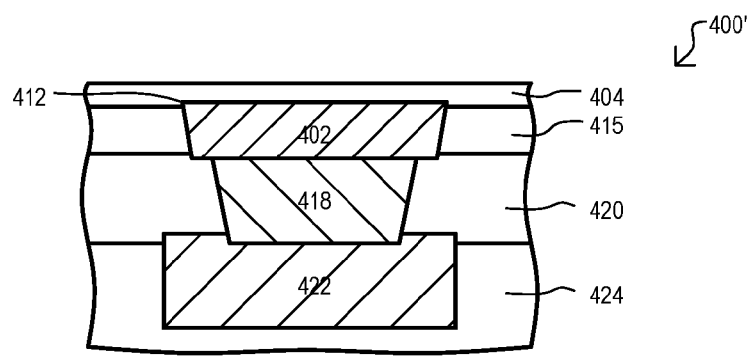

FIG. 4F shows the formation of insulating layer 404 over bottom structure 402, including over edges (e.g., 412). Insulating layer 404 can remove or reduce any unwanted irregularities of topography presented by an edge 412. Insulating layer 404 can be formed of any suitable insulating material, including but not limited to silicon oxide (including doped and undoped forms); silicon oxynitride; silicon nitride and/or polyimide, to name but a few. In one very particular embodiment, insulating layer 404 can include silicon nitride.

Figure 4G:
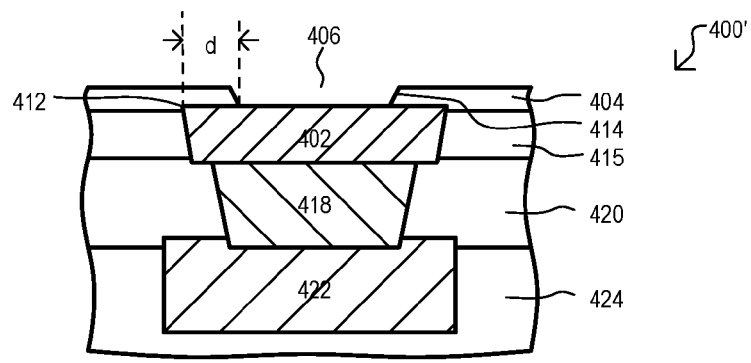

FIG. 4G shows the formation of opening 406 through insulating layer 404 to expose bottom structure 402. Opening 406 can include sloped sides 414. In one particular embodiment, an opening 406 can be formed with an etching step having parameters appropriate for forming sloped sides 414 given the material(s) of insulating layer 404. Opening 406 can be offset by a distance (d) from edge 412.

Figure 4H:
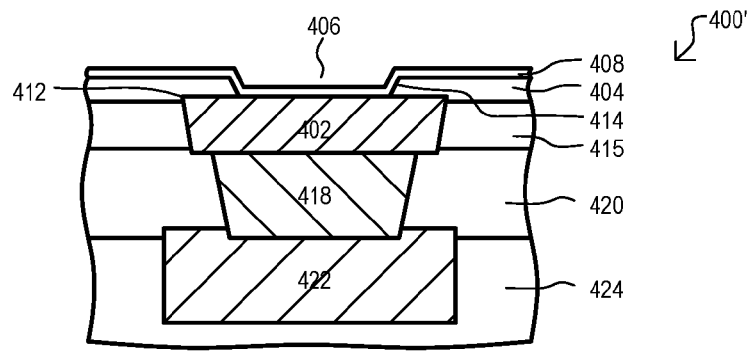

FIG. 4H shows the formation of programmable layer 408 over insulating layer 404 and within opening 406, including on sloped sides 414. A programmable layer 408 can be formed from any of those materials noted for embodiments herein, or equivalents. As noted above, a programmable layer 408 can be relatively thin as compared other layers of a storage element. A programmable layer 408 can have any of the thicknesses described for programmable layer 108 in FIG. 1 above.

Figure 4I:
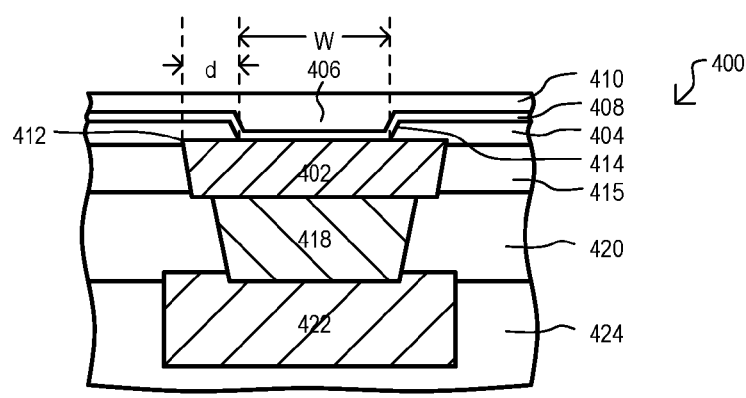

FIG. 4I shows the formation of a top layer 410 over programmable layer 408 and within opening 406. A top layer 410 can be formed from any of those materials noted for embodiments herein, or equivalents. In particular, in some embodiments, a programmable layer 408 can include a solid electrolyte and a top layer 410 can be an active layer, providing one or elements that ion conduct in the solid electrolyte. In other embodiments, a programmable layer 408 can include a solid electrolyte and a top layer 410 can be an inert electrode.

In some embodiments, a top layer 410 can be common to multiple storage elements, forming a "plate" structure.

Though not shown in FIGS. 4A to 4I, it is understood that additional layers can be formed over top layer 410.

FIGS. 5A to 5G show a method of making of storage element 500 according to another particular embodiment. The embodiment of FIGS. 5A to 5G can differ from that of FIGS. 4A to 4I in that a bottom structure can be formed with a patterning step, as opposed to a damascene approach. A storage element 500 can be another implementation of that shown in FIG. 1.

Figure 5A:
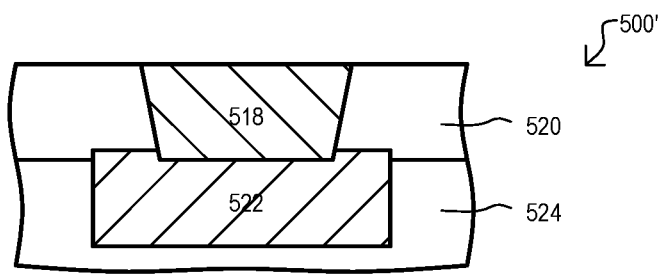
FIGS. 5A to 5G are a sequence of side cross sectional views showing methods of forming a storage element like that of FIG. 1, according to another particular embodiment.

FIG. 5A shows an initial structure 500' like that of FIG. 4A, and can be subject to the variations noted for FIG. 4A.

Figure 5B:
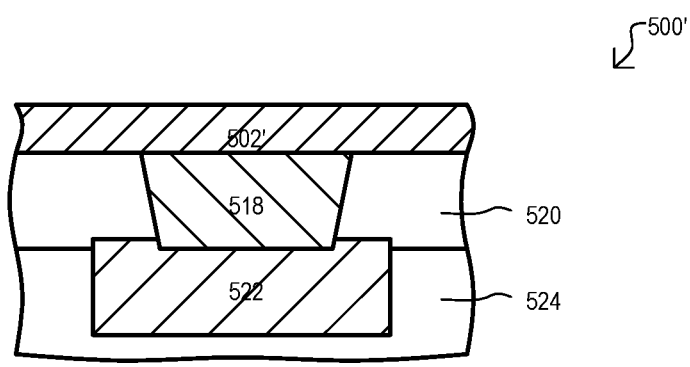

FIG. 5B shows the formation of a bottom structure material(s) layer 502'. Such materials can include any of those noted in FIG. 4D, or equivalents.

Figure 5C:
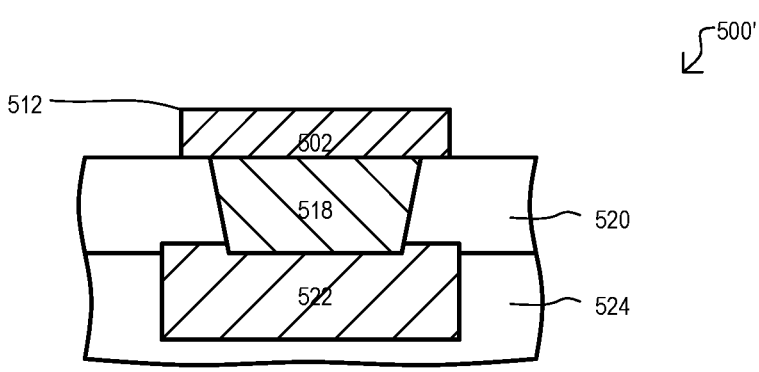

FIG. 5C shows a patterning step that can pattern bottom structure materials to create a bottom structure 502. In particular embodiments, such an action can include lithography and etch steps. In this way, a bottom structure 502 can be formed by patterning. As shown, the formation of bottom structure 502 can include an edge 512, which can present an adverse topography for subsequent thin layers, in conventional approaches like that of FIG. 14.

Figure 5D:
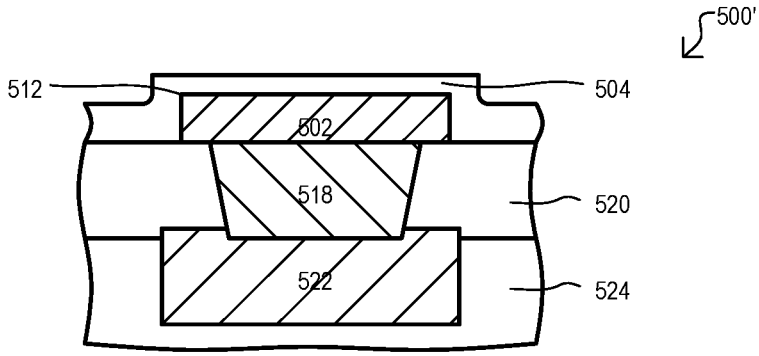

FIG. 5D shows the formation of insulating layer 504 over bottom structure 502, including over edges (e.g., 512). Insulating layer 404 can be formed of any suitable insulating material, including those noted in FIG. 4F. In one very particular embodiment, insulating layer 504 can be silicon nitride.

Figure 5E:
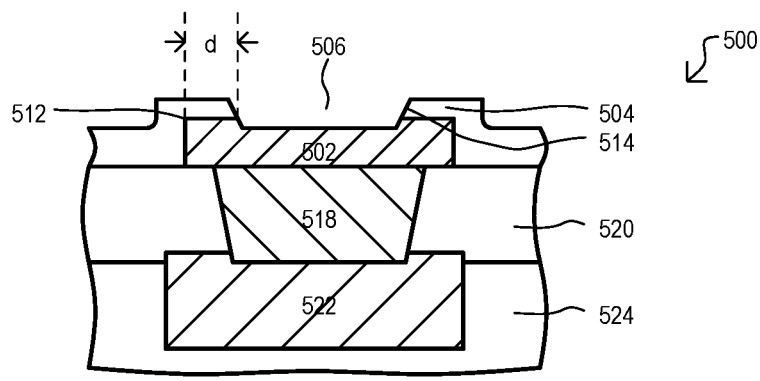

FIG. 5E shows the formation of opening 506 through insulating layer 504 to expose bottom structure 502. Opening 506 can include sloped sides 514. As in the case of FIG. 4G, an opening 506 can be formed with an etching step having parameters appropriate for forming sloped sides 514 given the material(s) of insulating layer 504. Also, opening 506 can be offset by a distance (d) from edge 512.

Figure 5F:
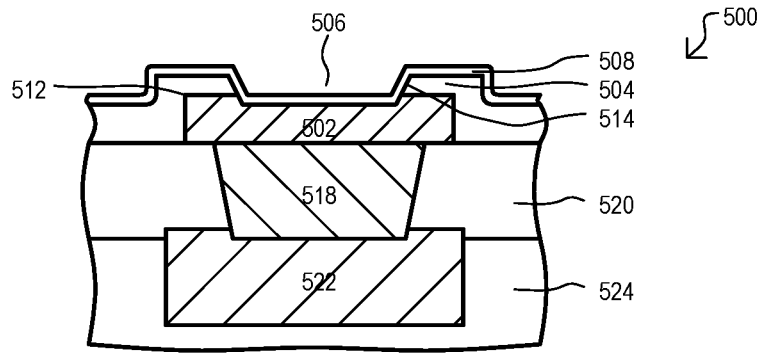

FIG. 5F shows the formation of programmable layer 508 over insulating layer 504 and within opening 506, including on sloped sides 514. A programmable layer 508 can be formed from any of those materials noted for embodiments herein, or equivalents, and can be a relatively thin layer, as compared other layers of a storage element. A programmable layer 508 can have any of the thicknesses described for layer 108 in FIG. 1 above.

Figure 5G:
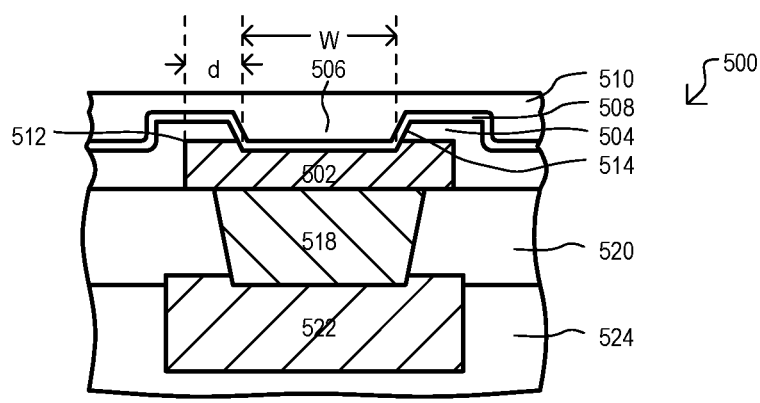

FIG. 5G shows the formation of a top layer 510 over programmable layer 508 and within opening 506. A top layer 510 can be formed from any of those materials noted for embodiments herein, or equivalents. It is also understood that a top layer 510 can be a plate layer and/or additional layers can be formed over top layer 510.

FIGS. 6A to 6H show a method of making of storage element 600 according to another particular embodiment. The embodiment of FIGS. 6A to 6H can differ from that of FIGS. 4A to 4I in that a bottom structure can be formed at a lower level in an integrated circuit layer hierarchy. A storage element 600 can be another implementation of that shown in FIG. 1.

Figure 6A:
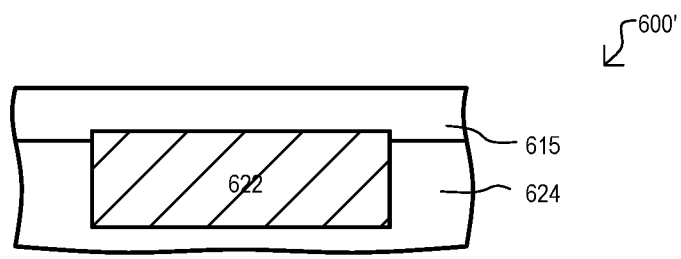
FIGS. 6A to 6H are a sequence of side cross sectional views showing methods of forming a storage element like that of FIG. 1, according to another particular embodiment.

FIG. 6A shows an initial structure 600' that includes a lower I/C structure 622 formed in a lower insulating layer 624. I/C structure 622 can provide vertical interconnection to other conductive layers, a horizontal interconnection to other conductive layers, or combinations thereof. In some embodiments, an I/C structure 622 can be a copper interconnect pattern.

Lower insulating layer 624 can be formed from any suitable insulating material, including but not limited to silicon oxide (including doped and undoped forms); silicon nitride; silicon oxynitride; and/or polyimide, to name but a few.

A bottom structure insulating layer 615 can be formed over I/C structure 622 and insulating layer 624. Insulating layer 615 can be formed of any suitable insulating material, and in particular embodiments, can be silicon nitride.

Figure 6B:
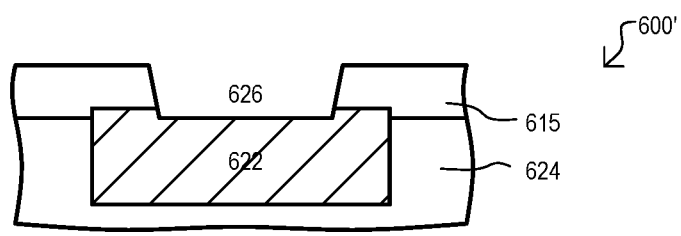

FIG. 6B shows the formation of a bottom structure opening 626 through bottom structure insulating layer 615 that exposes lower I/C structure 622. In one very particular embodiment, an opening formation step can utilize an existing via patterning approach. As but very particular embodiment, if reference is made back to FIG. 4A, a same etch mask used to create an opening for I/C structure 418 can be used to create opening 626. More particularly, if a fabrication process has a via formation mask, such a mask can be utilized in the formation of bottom structures of a storage element 600.

Figure 6C:
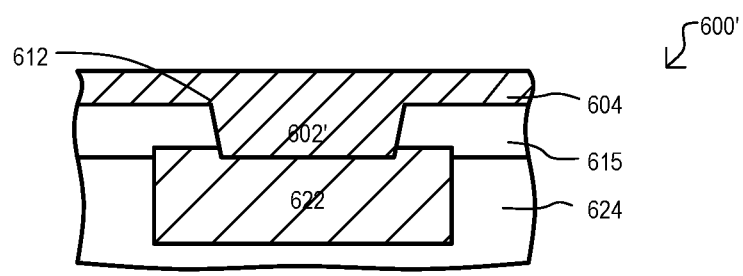

FIG. 6C shows the formation of bottom structure material(s) 602'. Such materials 602' can be any of those described in embodiments herein, or equivalents, including those for an inert electrode, or alternatively, an active layer. In one very particular embodiment, bottom structure material 602' can be tantalum.

Figure 6D:
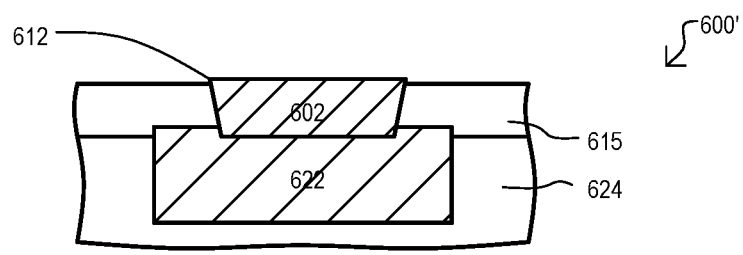

FIG. 6D shows an initial structure 600' following a planarization of a top surface for a damascene type formation of a bottom structure 602 having an edge 612.

Figure 6E:
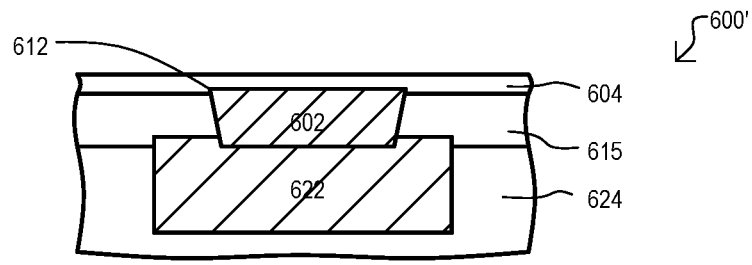
Figure 6F:
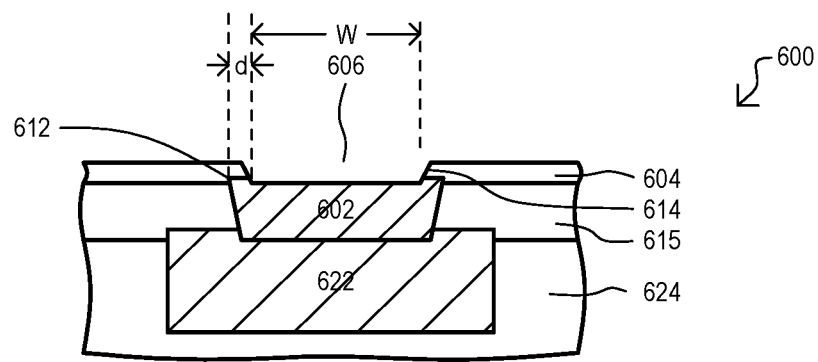
Figure 6G:
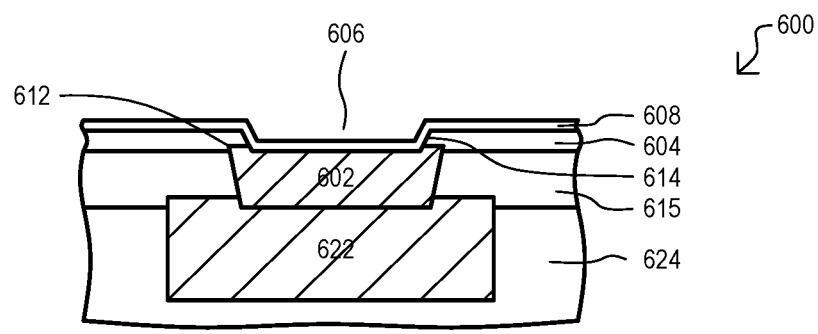
Figure 6H:
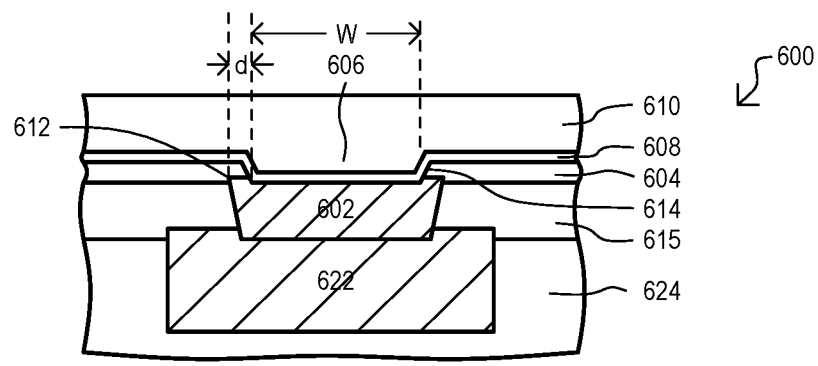

FIGS. 6E to 6H can follow the same general formation steps as FIGS. 4F to 4I, respectively. However, it is understood the storage element 600 can exist at a different (e.g., lower) fabrication level than that of FIG. 4I. An insulating layer 604 can be formed over bottom structure (FIG. 6E). An opening 606 with sloped sides 614 can be formed through insulating layer 604 that is offset from edge 612 (FIG. 6F). A programmable layer 608 can be formed in the opening 606 on the sloped sides 614 (FIG. 6G). A top layer 610 can be formed on programmable layer 608 including within opening 606.

FIGS. 7A to 7J show a method of making of storage element 700 according to another particular embodiment. The embodiment of FIGS. 7A to 7J can differ from that of FIGS. 4A to 4I in that a programmable layer is not formed within an opening, but rather below an opening. In addition, the embodiment of FIGS. 7A to 7J can utilize an etch stop layer to control the formation of an opening to a programmable layer. A storage element 700 can be one implementation of that shown in FIG. 3.

FIGS. 7A to 7D can follow the same or equivalent actions as FIGS. 6A to 6D.

Figure 7A:
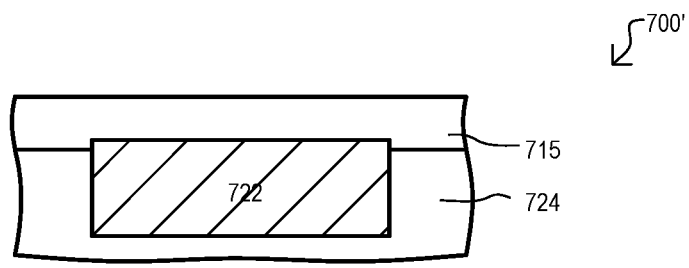
FIGS. 7A to 7J are a sequence of side cross sectional views showing methods of forming a storage element like that of FIG. 3, according to a particular embodiment.
Figure 7B:
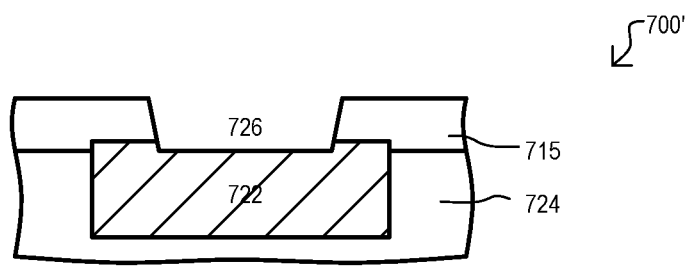
Figure 7C:
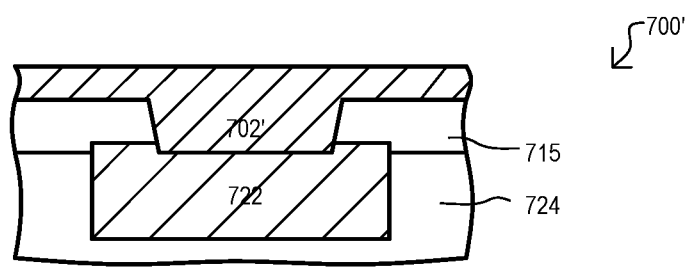
Figure 7D:
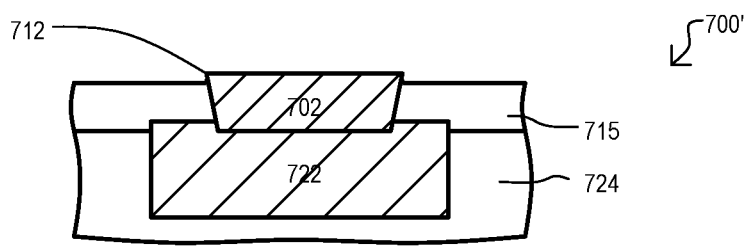
Figure 7E:
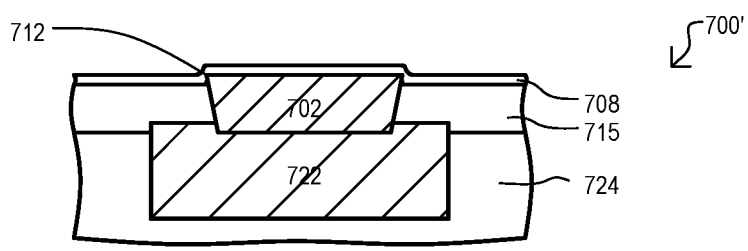

FIG. 7E shows the formation of programmable layer 708 over bottom structure 702, including over edge 712. A programmable layer 708 can be formed from any of those materials noted for embodiments herein, or equivalents, and can be a relatively thin layer, as compared other layers of a storage element. As understood from FIG. 14, formation of programmable layer 708 over edge 712 can result in an adverse narrowing of programmable layer 708. A programmable layer 708 can have a thickness as described for layer 108 of FIG. 1, including a thickness relative to a width (W) of an opening (the opening is formed subsequently in FIGS. 7I and 7J).

Figure 7F:
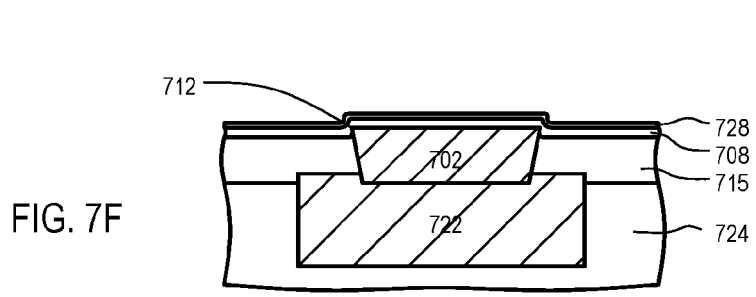

FIG. 7F shows the formation of an etch stop layer 728 over programmable layer 708. A etch stop layer 728 can protect a programmable layer 708 from being etched during the formation of an opening. As will be described below, the material(s) of an etch stop layer 728 can be selected based on a subsequently formed insulating layer (704) and an etch process used to form an opening.

Figure 7G:
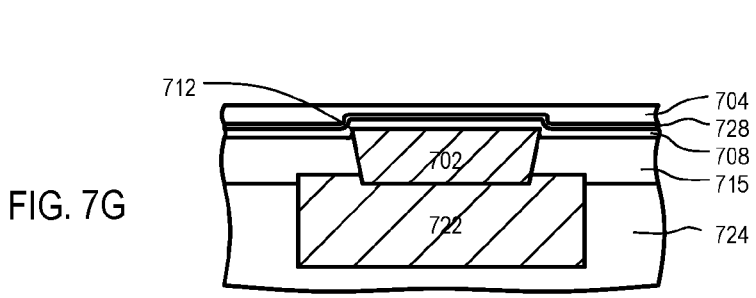

FIG. 7G shows the formation of insulating layer 704 over etch stop layer 728, including over locations of an edge 712. Insulating layer 704 can be formed of any suitable insulating material as noted for embodiments herein, or equivalents.

Figure 7H:
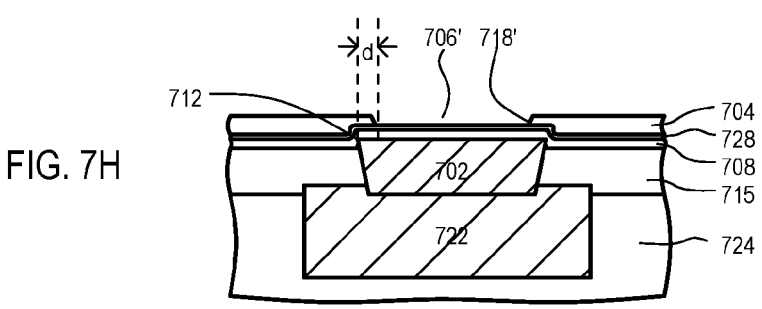

FIG. 7H shows the formation of a partial opening 706' through insulating layer 704 down to etch stop layer 728. In some embodiments, formation of partial opening 706' can include an etch that is highly selective between etch stop layer 728 and insulating layer 704. Thus, etch stop 728 can prevent programmable layer 708 from being etched when an opening is created in insulating layer 704. As shown, partial opening 706' can be offset with respect to edge 712 by a distance "d".

Figure 7I:
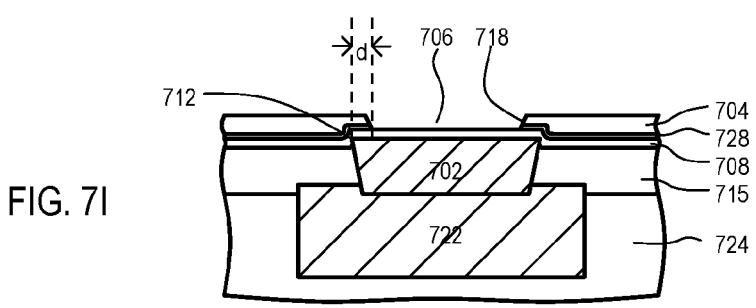

FIG. 7I shows the completion of opening 706 through insulating layer 704 and etch stop layer 728 to expose programmable layer 708. Such a step can include employing an etch that is highly selective between etch stop layer 728 and programmable layer 708. Opening 706 can include sides 718 with profiles that are sloped or that are substantially vertical. As shown, opening 706 can be offset with respect to edge 712.

Figure 7J:
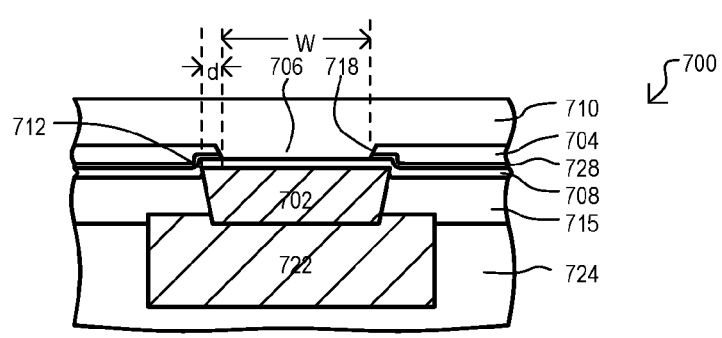

FIG. 7J shows the formation of a top layer 710 into opening 706 and in contact with programmable layer 708. Due to offset distance "d", top layer 710 does not contact programmable layer 708 at a location that can suffer from thinning (e.g., at edge 712). A top layer 710 can be formed from any of those materials noted for embodiments herein, or equivalents. It is also understood that a top layer 710 can be a plate layer and/or additional layers can be formed over top layer 710.

FIGS. 8A to 8H show a method of making of storage element 800 according to a further particular embodiment. The embodiment of FIGS. 8A to 8H can include approaches like those of FIGS. 7A to 7J, but with a bottom structure being formed by patterning, and not a damascene type approach. A storage element 800 can be one implementation of that shown in FIG. 3.

Figure 8A:
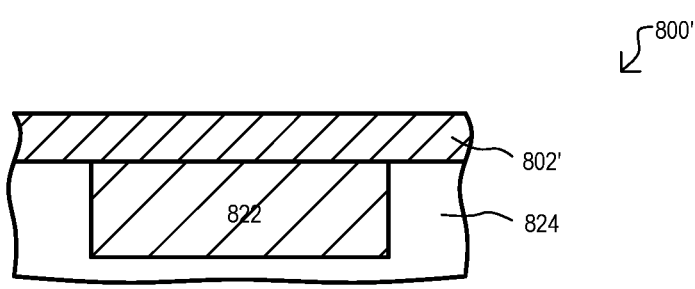
FIGS. 8A to 8H are a sequence of side cross sectional views showing methods of forming a storage element like that of FIG. 3, according to another particular embodiment.

FIG. 8A shows the formation of a bottom structure material(s) layer 802'. Such materials can include any of those noted in FIG. 4D, or equivalents. Bottom structure material(s) 802' can be formed on, and in contact with, an I/C structure 822. An I/C structure 822 can provide vertical interconnection to other conductive layers, horizontal interconnection to other conductive layers, or combinations thereof. In some embodiments, an I/C structure 822 can be a copper interconnect pattern. I/C structure 822 can be formed in lower insulating layer 824 which can be formed from any suitable insulating material, as described for embodiments herein.

Figure 8B:
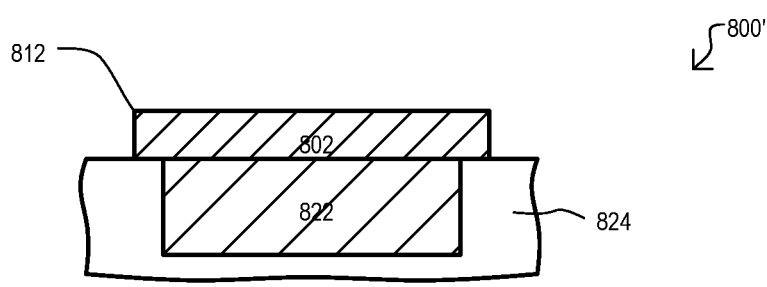

FIG. 8B shows a patterning step that can pattern bottom structure materials to create a bottom structure 802. Such an action can include steps like those of FIG. 5C, or equivalents. In particular embodiments that include a solid electrolyte layer, a bottom structure 802 can be an inert electrode, or alternatively an active layer, as described for embodiments herein. A bottom structure 802 can include an edge 812.

Figure 8C:
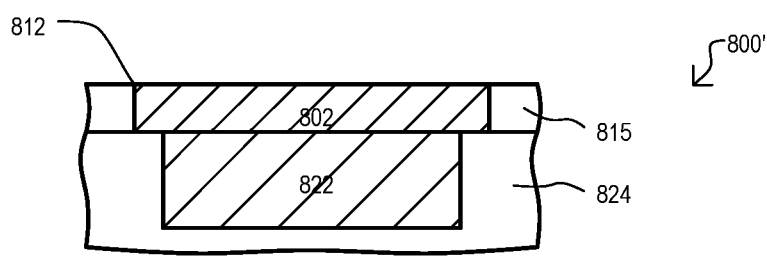

FIG. 8C shows the formation of insulating layer 815 over bottom structure 802, and a subsequent planarization step. A top surface of bottom structure 802 can be exposed. Such a step can result in topography at edge 812 that can be adverse to very thin layers.

Figure 8D:
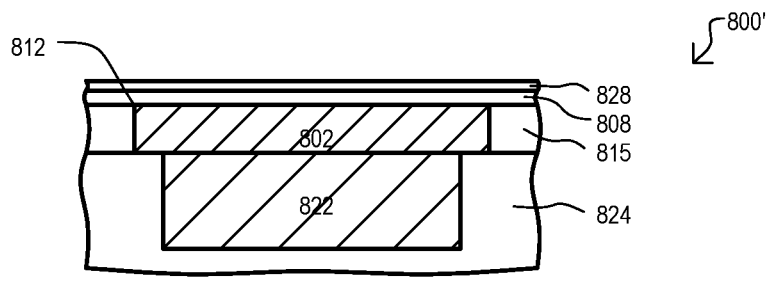
Figure 8E:
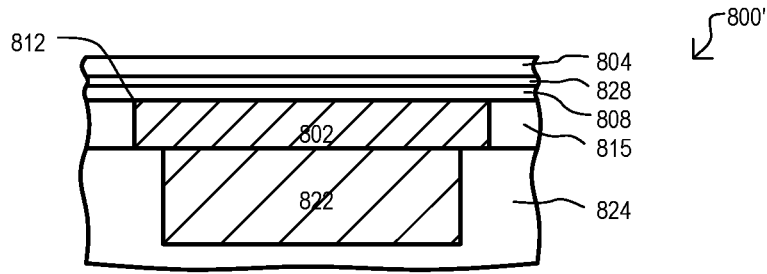
Figure 8F:
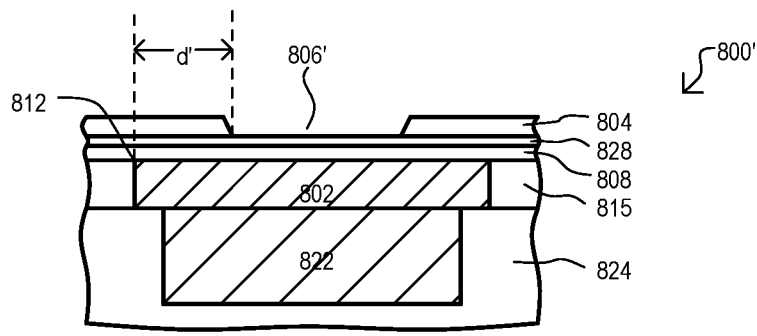
Figure 8G:
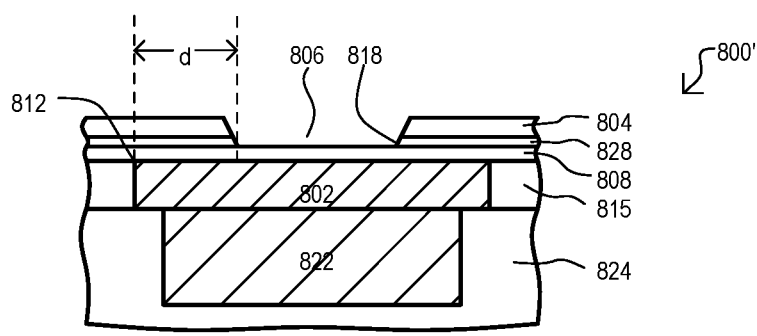
Figure 8H:
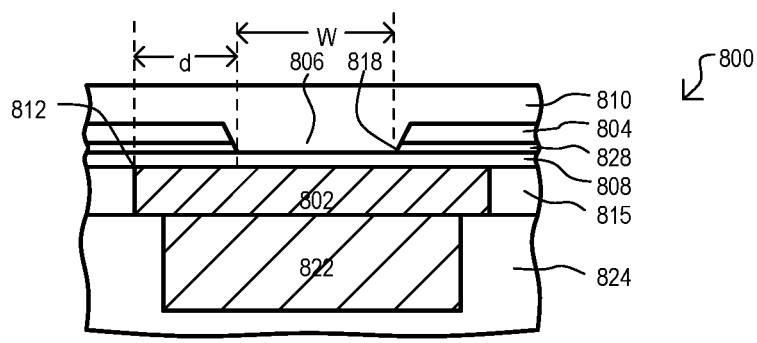

FIG. 8D shows the formation of a programmable layer 808 over bottom structure 802, including over edge 812. A programmable layer 808 can be formed from any of those materials noted for embodiments herein, or equivalents, and can be a relatively thin layer, as compared other layers of a storage element. As understood from FIG. 14, formation of programmable layer 808 over edge 812 can result in an adverse narrowing of programmable layer 808. FIG. 8D also shows the formation of an etch stop layer 828 over programmable layer 808. A etch stop layer 828 can protect a programmable layer 808 and be selected in the same or an equivalent manner, to etch layer 728 described for FIGS. 7E to 7I.

FIGS. 8E to 8H can follow actions like those described for FIGS. 7G to 7J, or equivalents. This can include: the formation of insulating layer 804 (FIG. 8E); etching through insulating layer 804 to etch stop layer 828 (FIG. 8F); removing etch stop layer 828 to create opening 806 and expose programmable layer 808 (FIG. 8G); and forming top layer 810 in opening 806 in contact with programmable layer 808.

FIGS. 9A to 9F show a method of making of storage element 900 according to a further particular embodiment. The embodiment of FIGS. 9A to 9F can include approaches like those of FIGS. 6A to 6H, forming a bottom structure at a lower level in an integrated circuit layer hierarchy. However, unlike FIGS. 6A to 6H, a bottom structure can be formed by patterning, as opposed to a damascene type approach. A storage element 900 can be one implementation of that shown in FIG. 1.

Figure 9A:
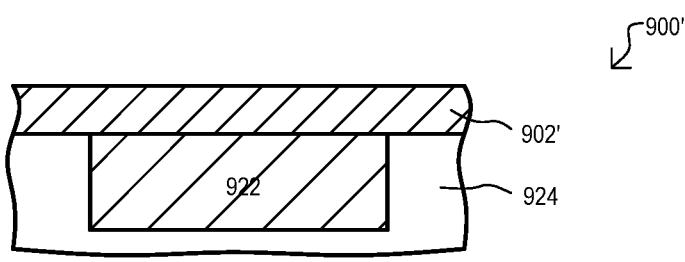
FIGS. 9A to 9F are a sequence of side cross sectional views showing methods of forming a storage element like that of FIG. 1, according to another particular embodiment.
Figure 9B:
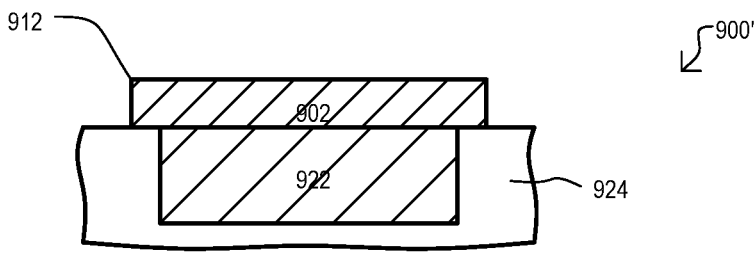
Figure 9C:
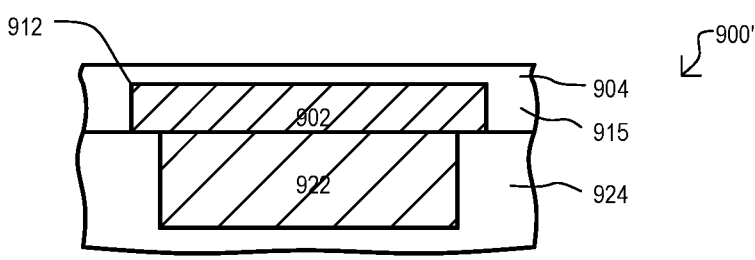

FIGS. 9A to 9C can include actions like those shown in FIGS. 5B to 5D, or equivalents, but performed on a lower level in an interconnect hierarchy. Such actions can result in an initial storage element structure 900' having a bottom structure 902 with an edge 912 covered with an insulating layer 904.

Figure 9D:
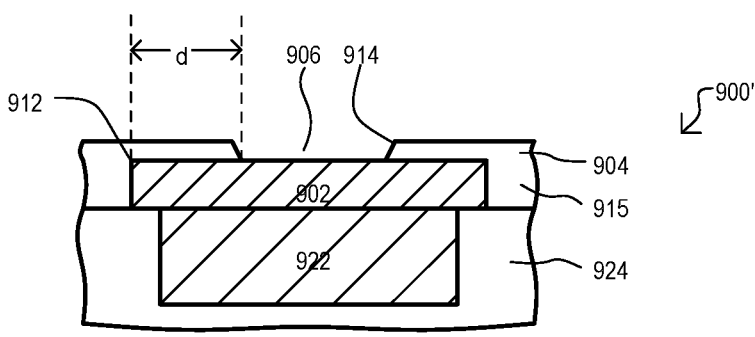
Figure 9E:
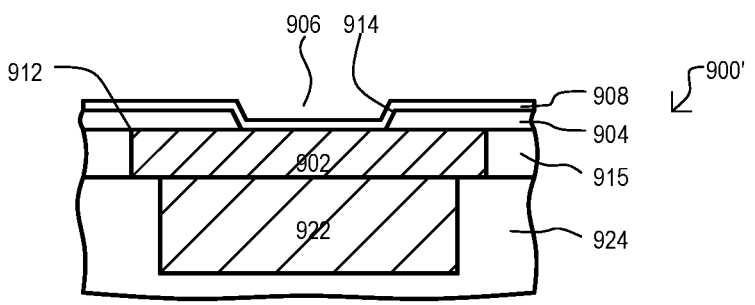
Figure 9F:
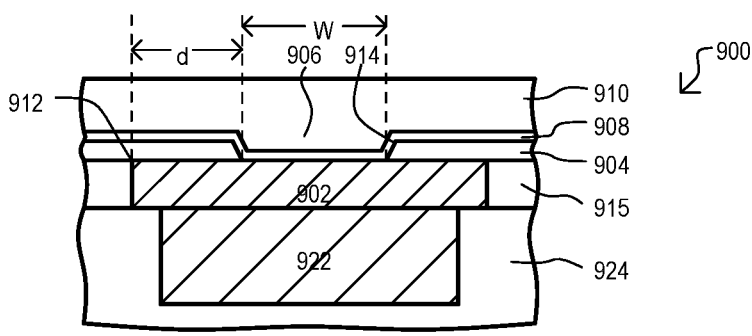

FIGS. 9D to 9F can include actions like those shown in FIGS. 4G to 4I, or equivalents, but performed on a lower level of an interconnect hierarchy. Such actions can result in a programmable layer 908 formed on sloped sides 914 of an opening 906 that is offset (by a distance d) from the edge 912 of a bottom structure 902.

While the embodiment of FIGS. 7A to 7J includes an etch stop layer 728 to protect a programmable layer 708 during the formation of an opening, in some embodiments, a programmable layer can be sufficiently robust, or an etch sufficiently selective between a programmable layer and overlying insulating layer(s) that an etch stop layer can be excluded. Such embodiments are shown in FIGS. 10A to 10H and 11A to 11G.

FIGS. 10A to 10H show a method of making of storage element 1000 according to a further particular embodiment. The embodiment of FIGS. 10A to 10H can include approaches like those of FIGS. 7A to 7J, however, without the inclusion of an etch stop layer. A storage element 1000 can be one implementation of that shown in FIG. 3.

FIGS. 10A to 10E can include actions like those of FIGS. 7A to 7E, or equivalents.

Figure 10A:
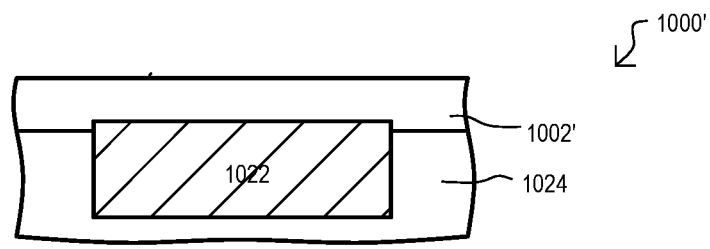
FIGS. 10A to 10H are a sequence of side cross sectional views showing methods of forming a storage element like that of FIG. 3, according to another particular embodiment.
Figure 10B:
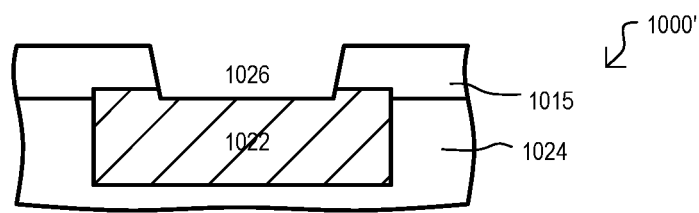
Figure 10C:
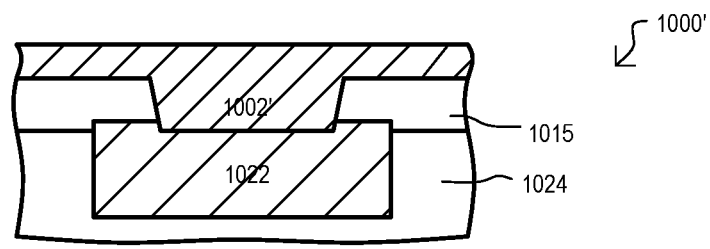
Figure 10D:
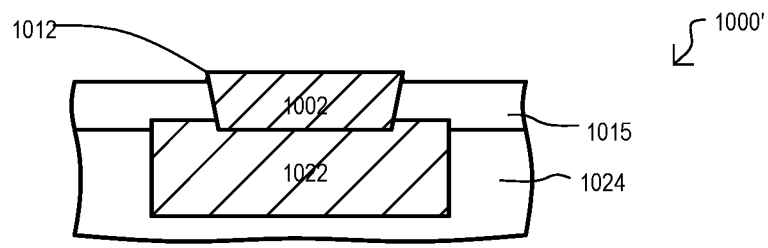
Figure 10E:
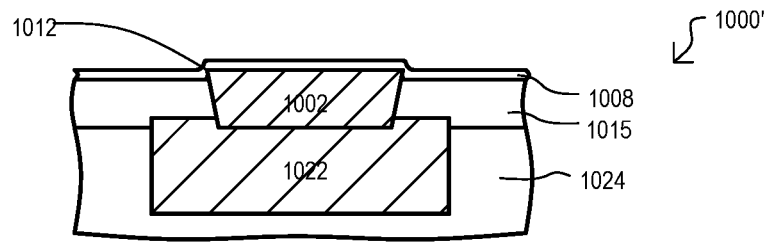
Figure 10F:
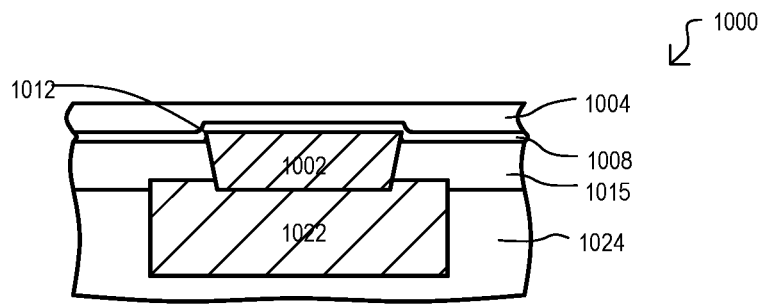
Figure 10G:
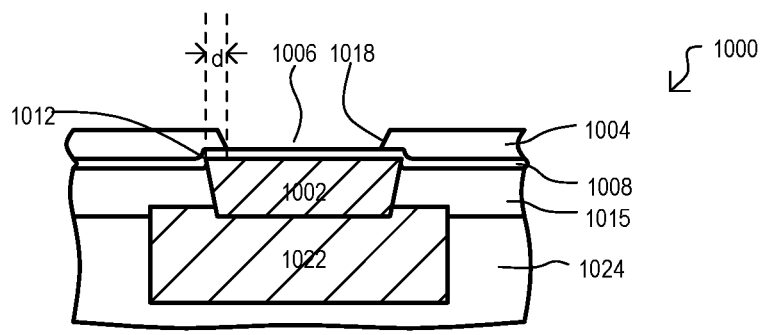
Figure 10H:
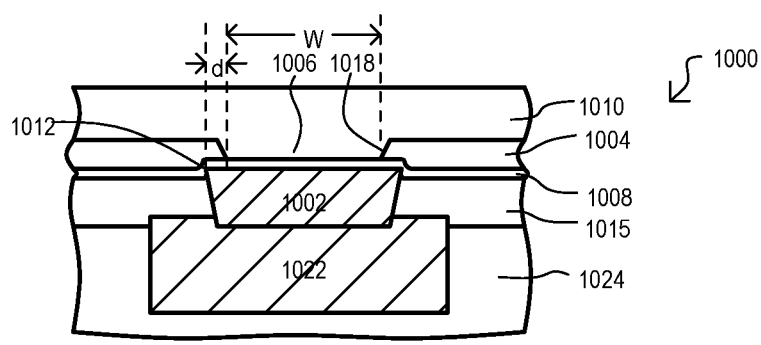

Unlike the embodiment of FIGS. 7A to 7J, FIG. 10F shows the formation of insulating layer 1004 on programmable layer 1008, as opposed to an etch stop layer. FIG. 10G shows the formation of an opening 1006 through insulating layer 1004 that is offset from an edge 1012 by a distance "d". FIG. 10H shows the formation of a top layer 1010 over programmable layer 1008. Such steps can include variations of other embodiments herein.

FIGS. 11A to 11G show a method of making of storage element 1100 according to a further particular embodiment. The embodiment of FIGS. 11A to 11G can include approaches like those of FIGS. 8A to 8H, however, without the inclusion of an etch stop layer. A storage element 1100 can be one implementation of that shown in FIG. 3.

Figure 11A:
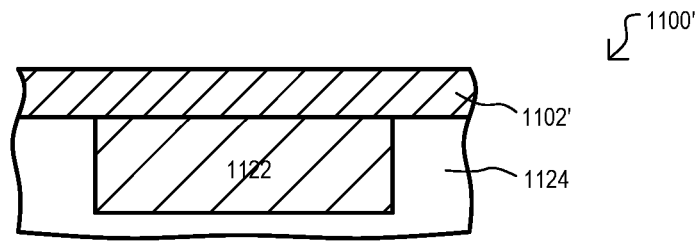
FIGS. 11A to 11G are a sequence of side cross sectional views showing methods of forming a storage element like that of FIG. 3, according to another particular embodiment.
Figure 11B:
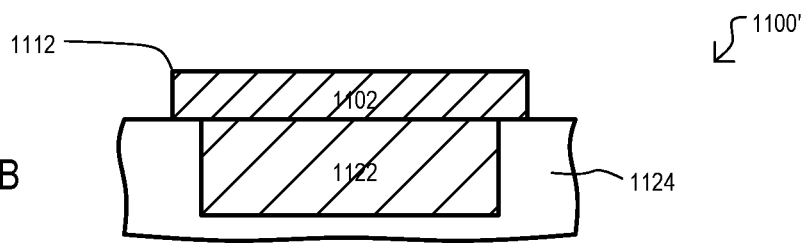
Figure 11C:
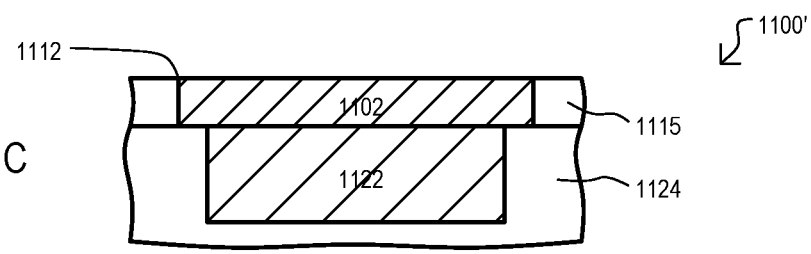
Figure 11D:
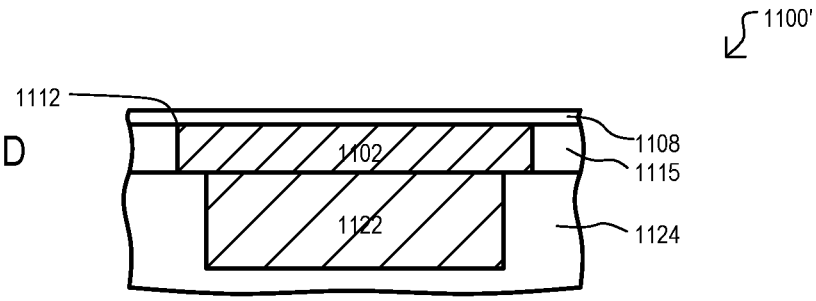
Figure 11E:
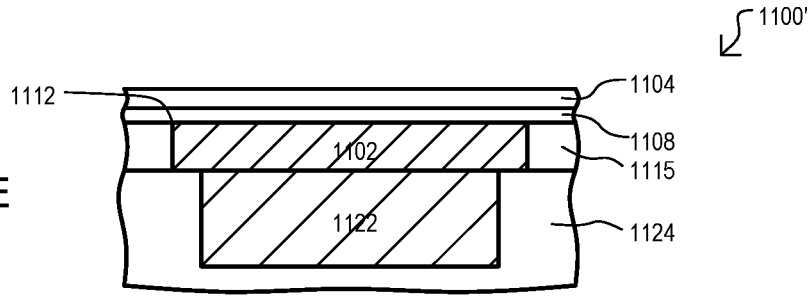

FIGS. 11A to 11C can include actions like those of FIGS. 8A to 8C, or equivalents.

Figure 11F:
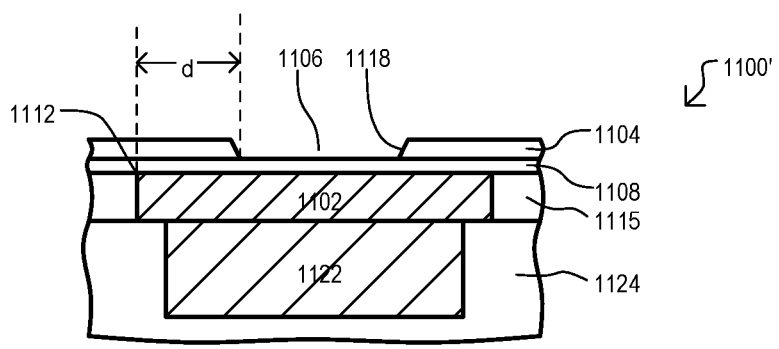
Figure 11G:
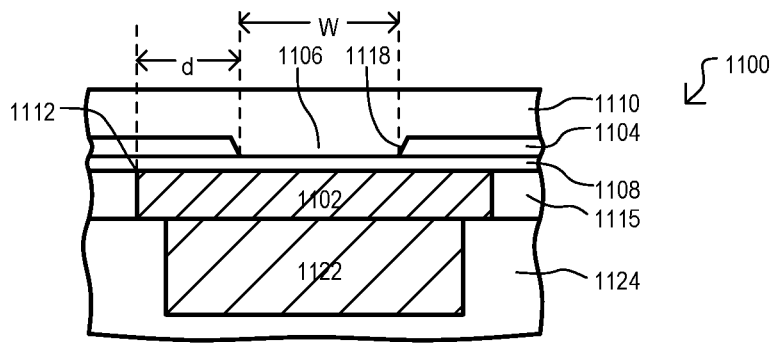

Unlike the embodiment of FIGS. 8A to 8H, FIG. 11E shows the formation of insulating layer 1104 on programmable layer 1108, as opposed to an etch stop layer. Further, FIG. 11F shows the formation of an opening 1006 through insulating layer 1004 that is offset from an edge 1012 by a distance "d". FIG. 11G shows the formation of a top layer 1110 over programmable layer 1108. Such steps can include variations of other embodiments herein.

FIGS. 12A to 12E show a method of making of storage element 1200 according to another particular embodiment. A storage element 1200 can be one implementation of that shown in FIG. 2.

Figure 12A:
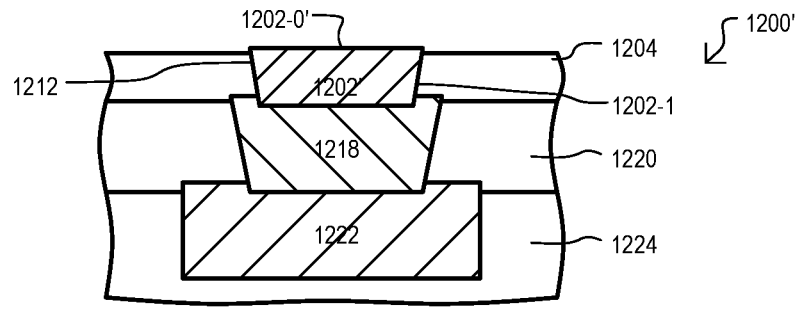
FIGS. 12A to 12E are a sequence of side cross sectional views showing methods of forming a storage element like that of FIG. 2, according to a particular embodiment.

FIG. 12A shows an initial structure 1200' that includes an initial bottom structure 1202', a first lower I/C structure 1218 formed in a first lower insulating layer 1220 in contact with a second I/C structure 1222 formed in a second lower insulating layer 1224. First and second I/C structure (1218/1222) can provide vertical interconnection to other conductive layers as described for embodiments herein. Lower insulating layers 1220/1224 can be formed from any suitable insulating material, as described for embodiments herein, or equivalents.

An initial bottom structure 1202' can be formed in an insulating layer 1204, and can have an initial top surface 1202-0' and a sloped side surface 1202-1. In a very particular embodiment, an initial bottom structure 1202' can be formed with damascene techniques that create an opening with sloped sides. Alternatively, etching techniques (e.g., "over etching") can be used in a patterning step (e.g., lithography and etch) to create a side surface with a negative slope. It is understood that a sloped side surface 1202-1 can have a non-linear shape.

An initial bottom structure 1202' can be formed from any of the bottom structure materials described for embodiments herein, or equivalents, including those for an inert electrode, or alternatively, an active layer. However, such a material is capable of being transformed (e.g., oxidized) into another material for subsequent removal. In one very particular embodiment, an initial bottom structure 1202' can be tantalum.

Figure 12B:
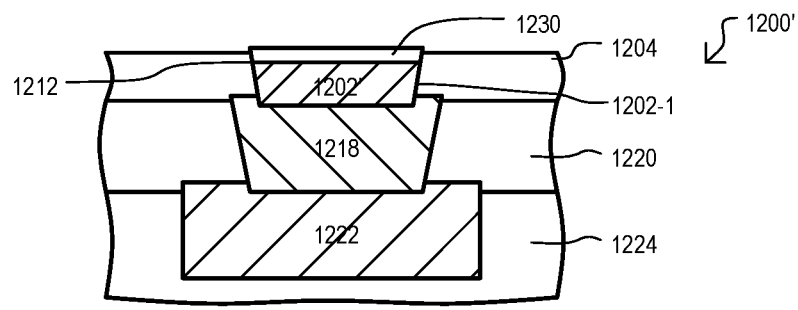

FIG. 12B shows the transformation of a top portion of initial bottom structure 1202' to create removable portion 1230. In one particular embodiment, a removable portion 1230 can be created by oxidizing a surface of initial bottom structure 1202'. It is understood that removable portion 1230 can be removed to leave a remaining portion of the initial bottom structure 1202'.

Figure 12C:
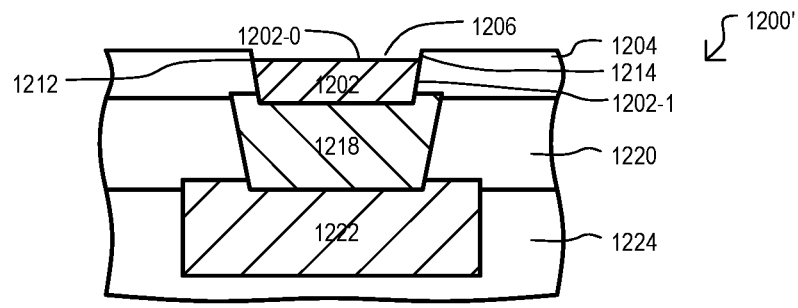

FIG. 12C shows the structure 1200' after removing the removable portion 1230. In some embodiments, such an action can include etching with an etch that is highly selective between the bottom structure 1202 and removable portion 1203. As shown, after such a removal step, an initial structure 1200' can include an opening 1206 that exposes a top surface 1202-0 of bottom structure 1202. Such an opening 1206 can include a sloped side 1214. Sloped side 1214 can follow the profile of the side surface 1202-1 of bottom structure 1202. Further, the bottom structure 1202 can include an edge 1212.

Figure 12D:
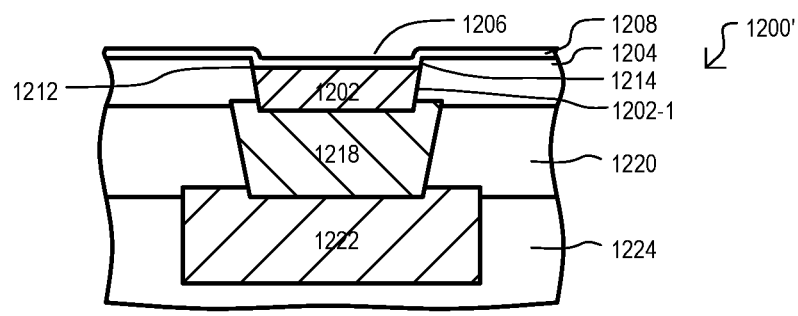

FIG. 12D shows the formation of programmable layer 1208 within opening 1206 along sloped sides 1214. A programmable layer 1208 can be formed from any of those materials noted for embodiments herein, or equivalents. As noted above, a programmable layer 1208 can be relatively thin compared other layers of a storage element. A programmable layer 1208 can have any of the thicknesses described for FIG. 1 above. Due the sloped sides 1214 of opening, a programmable layer 1208 can avoid the narrowing that can occur in conventional approaches, like that of FIG. 14.

Figure 12E:
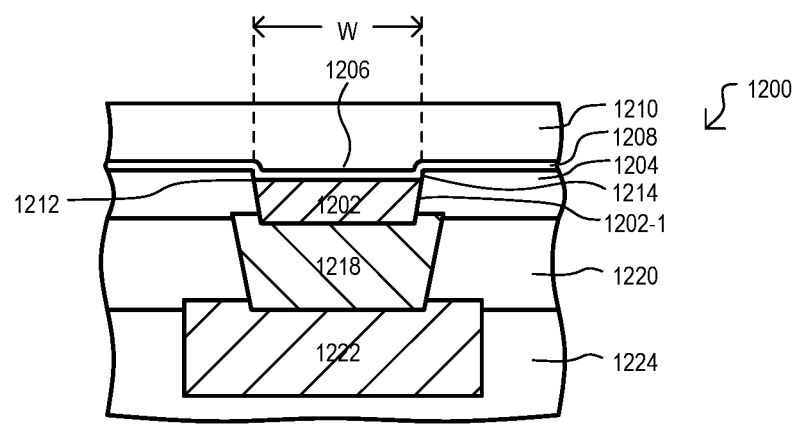

FIG. 12E shows the formation of a top layer 1210 over programmable layer 1208 and within opening 1206. A top layer 1210 can be formed from any of those materials noted for embodiments herein, or equivalents. It is also understood that a top layer 1210 can be a plate layer and/or additional layers can be formed over top layer 1210.

FIGS. 13A to 13D show a method of making of storage element 1300 according to another particular embodiment. A storage element 1300 can be one implementation of that shown in FIG. 2.

Figure 13A:
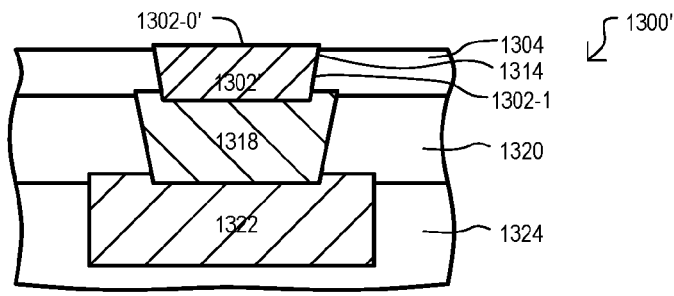
FIGS. 13A to 13D are a sequence of side cross sectional views showing methods of forming a storage element like that of FIG. 2, according to another particular embodiment.

FIG. 13A shows an initial structure 1300' like that of FIG. 12A. Such an initial structure 1300' can include materials and can be formed in same or an equivalent fashion.

Figure 13B:
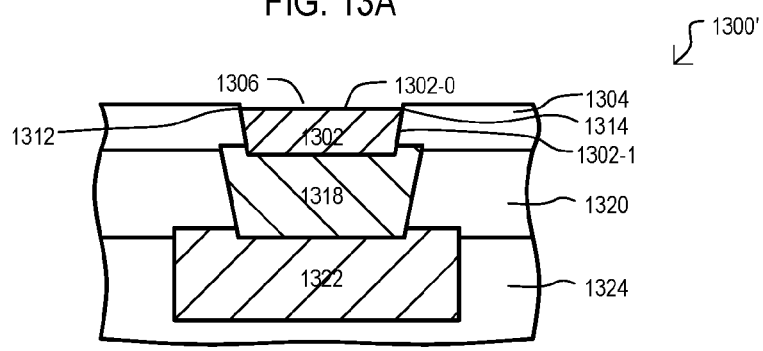

FIG. 13B shows the initial structure 1300' after removing a top portion of an initial bottom structure 1302'. In some embodiments, such an action can include etching with an etch that is highly selective between insulating layer 1304 and a bottom structure 1302. Such a removal step can include any techniques suitable for the materials uses, including but not limited to: dry etching, wet etching, and/or chemical-mechanical polishing (CMP). As shown, after such a removal step, an initial structure 1300' can include an opening 1306 that exposes a top surface 1302-0 of bottom structure 1302. Such an opening 1306 can include a sloped side 1314 that can follow the profile of the side surface 1302-1 of bottom structure 1302. Bottom structure 1302 can include an edge 1312.

Figure 13C:
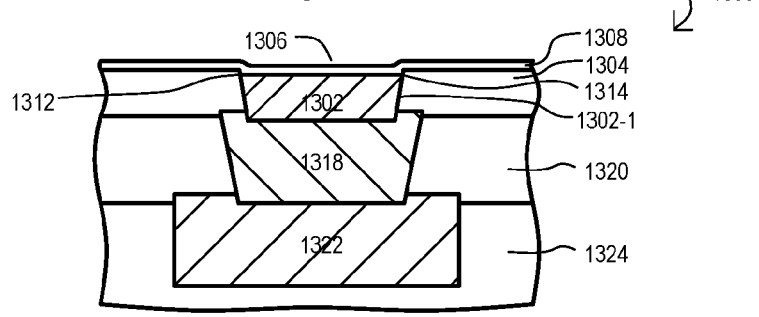
Figure 13D:
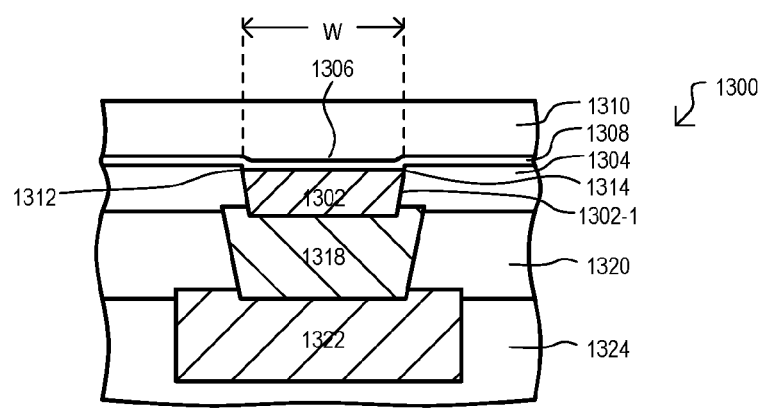

FIGS. 13C and 13D show processes like those of FIGS. 12D and 12E, and can include the same or equivalent materials and process steps.

It should be appreciated that reference throughout this description to "one embodiment" or "an embodiment" means that a particular feature, structure or characteristic described in connection with the embodiment is included in at least one embodiment of an invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

It is also understood that other embodiments of this invention may be practiced in the absence of an element/step not specifically disclosed herein.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A method, comprising:
    forming a bottom structure with a top surface and a side surface that form at least one edge;
    forming an opening with sloped sides through at least one insulating layer to expose at least a portion of the top surface of the bottom structure; wherein
    forming the opening includes depositing an insulating layer over the bottom structure, and forming an opening through the insulating layer having sloped sides, the opening being offset from the at least one edge;
    forming a programmable layer over the at least one edge, in contact with the sloped sides of the opening and the top surface of the bottom structure; and
    forming a top layer over the programmable layer and opening; wherein
    the programmable layer is programmable between at least two different impedance states.

2. The method of claim 1, wherein:
    depositing the insulating layer over the bottom structure includes depositing the insulating layer in contact with the top surface and side surface of the bottom structure.

3. The method of claim 1, wherein:
    forming the bottom structure includes
        forming a structure opening in a bottom structure insulating layer,
        forming a bottom structure material in the structure opening and on a top surface of the bottom structure insulating layer, and
        planarizing to remove the bottom structure material from the top surface of the bottom structure insulating layer to form the top surface of the bottom structure and expose a portion of the side surface of the bottom structure that extends above the top surface of the bottom structure insulating layer.

4. The method of claim 1, wherein:
    forming the bottom structure includes forming an initial bottom structure in an insulating layer, the bottom structure having side surfaces that slope inward; and
    forming the opening includes removing a top portion of the initial bottom structure to form the opening and the bottom structure, the sides of the opening following the sloped sides of the initial bottom structure.

5. The method of claim 1, further including:
    the programmable layer comprises a solid electrolyte; and
    forming an ion source for at least one element that is ion conductible within the solid electrolyte; wherein
    the ion source is selected from the group of: the top layer and the bottom structure.

6. The method of claim 1, further including:
    forming a conductive lower structure having a first width in a first direction parallel to the top surface of the bottom structure; and
    forming the bottom structure on, and in contact with, the conductive lower structure, the bottom structure having a second width in the first direction that is greater than the first width.

7. A method, comprising:
forming a bottom structure having at least one edge formed at the intersection of a top surface and side surface; wherein
forming the bottom structure includes forming a structure opening in a bottom structure insulating layer,
forming a bottom structure material in the structure opening and on a to surface of the bottom structure insulating layer, and
planarizing to remove the bottom structure material from the top surface of the bottom structure insulating layer to form the top surface of the bottom structure and expose a portion of the side surface of the bottom structure that extends above the top surface of the bottom structure insulating layer;
forming a programmable layer over the at least one edge and in contact with at least the top surface of the bottom structure;
forming a cover layer over the programmable layer;
forming an opening through the cover layer, offset from the at least one edge, that exposes the programmable layer; and
forming a top layer in contact with the programmable layer.

8. The method of claim 7, wherein:
the programmable layer contacts the top surface of the bottom structure at the at least one edge.

9. The method of claim 7, wherein:
the cover layer is an insulating layer.

10. The method of claim 7, wherein:
the cover layer is an etch stop layer; and
forming the opening includes
   forming an insulating layer over the etch stop layer,
   forming an initial opening through the insulating layer with a first etch that is highly selective with respect to the etch stop layer, and
   continuing the opening through the etch stop layer with a second etch different from the first etch to expose the programmable layer.

11. The method of claim 7, further including:
forming a conductive lower structure having a first width in a first direction parallel to the top surface of the bottom structure; and
forming the bottom structure on, and in contact with, the conductive lower structure, the bottom structure having a second width in the first direction that is greater than the first width.

12. The method of claim 7, further including:
the programmable layer comprises a solid electrolyte; and
forming an ion source for at least one element that is ion conductible within the solid electrolyte; wherein
the ion source is selected from the group of: the top layer and the bottom structure.

13. A method, comprising:
forming a bottom structure with a top surface and a side surface that form at least one edge that extends above a bottom structure insulating layer; wherein
forming the bottom structure includes forming a structure opening in a bottom structure insulating layer,
forming a bottom structure material in the structure opening and on a to surface of the bottom structure insulating layer, and
planarizing to remove the bottom structure material from the to surface of the bottom structure insulating layer to form the to surface of the bottom structure and expose a portion of the side surface of the bottom structure that extends above the top surface of the bottom structure insulating layer;
forming at least one second insulating layer in contact with the at least one edge;
forming an opening through at least the second insulating layer to expose at least a portion of the top surface of the bottom structure;
forming a programmable layer over the at least one edge, in contact with sides of the opening and in contact with the top surface of the bottom structure; and
forming a top layer over the programmable layer and opening; wherein
the programmable layer is programmable between at least two different impedance states.

14. The method of claim 13, wherein:
forming the opening offset from the at least one edge so that the at least one edge remains covered with at least the second insulating layer.

15. The method of claim 13, wherein:
forming the opening includes removing at least a portion of the bottom structure.

16. The method of claim 13, further including:
forming a conductive lower structure having a first width in a first direction parallel to the top surface of the bottom structure; and
forming the bottom structure on, and in contact with, the conductive lower structure, the bottom structure having a second width in the first direction that is greater than the first width.

17. The method of claim 13, further including:
the programmable layer comprises a solid electrolyte; and
forming an ion source for at least one element that is ion conductible within the solid electrolyte; wherein
the ion source is selected from the group of: the top layer and the bottom structure.

* * * * *